(12) United States Patent
Prentice

(10) Patent No.: US 11,947,094 B1
(45) Date of Patent: Apr. 2, 2024

(54) DUAL CAMERA PRISM ASSEMBLY FOR STENCIL PRINTER

(71) Applicant: Illinois Tool Works Inc., Glenview, IL (US)

(72) Inventor: Thomas C. Prentice, Westford, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 18/125,270

(22) Filed: Mar. 23, 2023

(51) Int. Cl.
| | |
|---|---|
| *B41F 15/12* | (2006.01) |
| *G02B 17/04* | (2006.01) |
| *G03B 15/05* | (2021.01) |
| *G03B 17/55* | (2021.01) |
| *H04N 23/50* | (2023.01) |
| *H04N 23/74* | (2023.01) |
| *H04N 23/90* | (2023.01) |
| *H05K 3/12* | (2006.01) |
| *H05K 7/20* | (2006.01) |

(52) U.S. Cl.
CPC .............. *G02B 17/04* (2013.01); *B41F 15/12* (2013.01); *G03B 15/05* (2013.01); *G03B 17/55* (2013.01); *H04N 23/50* (2023.01); *H04N 23/74* (2023.01); *H04N 23/90* (2023.01); *H05K 3/1225* (2013.01); *H05K 7/2039* (2013.01); *G03B 2215/0567* (2013.01)

(58) Field of Classification Search
None
See application file for complete search history.

(56) References Cited

U.S. PATENT DOCUMENTS

| | | | |
|---|---|---|---|
| 5,943,089 A | 8/1999 | Douglas | |
| 8,453,567 B2 * | 6/2013 | Aiba ........................ | B41F 15/26 101/485 |
| 2008/0130068 A1 * | 6/2008 | Zhang ................... | G01N 21/956 358/474 |
| 2008/0197170 A1 * | 8/2008 | Prince .............. | G01N 21/95684 228/103 |
| 2014/0210993 A1 * | 7/2014 | Butler .................. | G06V 10/772 348/87 |

FOREIGN PATENT DOCUMENTS

| | | | | |
|---|---|---|---|---|
| CN | 2938734 Y | * | 8/2007 | |
| DE | 19728144 A1 | * | 1/1999 | .............. B41M 1/12 |

* cited by examiner

*Primary Examiner* — Leslie J Evanisko
(74) *Attorney, Agent, or Firm* — Lando & Anastasi, LLP

(57) ABSTRACT

A vision system is used in a stencil printer configured to print an assembly material on an electronic substrate. The vision system includes a housing, a dual camera assembly supported by the housing and a prism assembly supported by the housing and configured with the dual camera assembly to provide a first optical path that looks vertically up at a bottom of a stencil and a second optical path that looks vertically down on an electronic substrate.

27 Claims, 11 Drawing Sheets

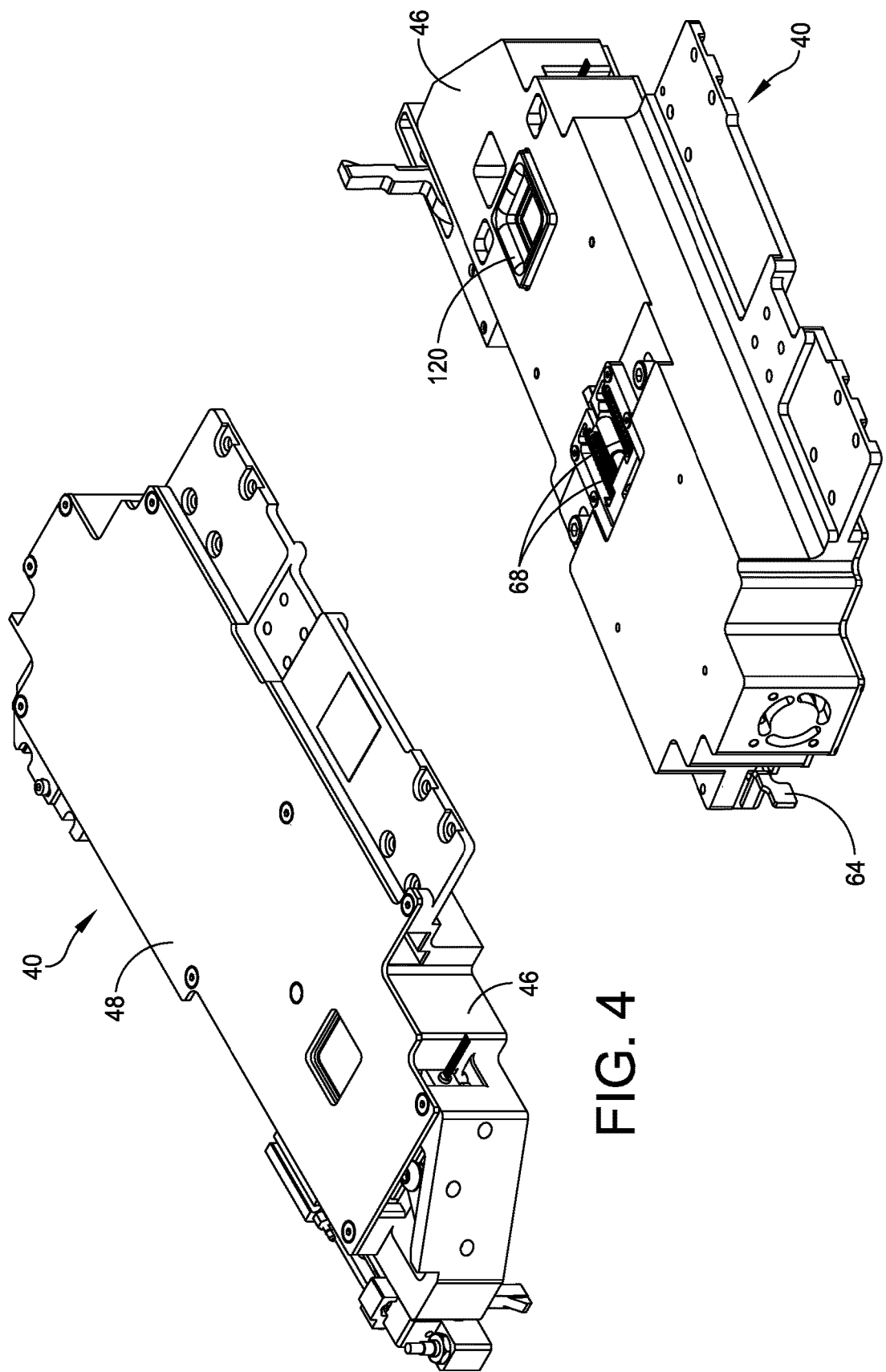

DUAL CAMERA PRISM ASSEMBLY FOR STENCIL PRINTER

BACKGROUND OF THE DISCLOSURE

1. Field of Invention

This application relates generally to electronic automation equipment utilized in the production and assembly of electronic circuit boards, and more specifically to stencil printers used to deposit patterns of solder paste or other paste-like materials onto an electronic substrate.

2. Discussion of Related Art

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system embodying a vision system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the circuit board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge. The stencil is then separated from the circuit board and the adhesion between the circuit board and the solder paste causes most of the material to stay on the circuit board. Material left on the surface of the stencil is removed in a cleaning process before additional circuit boards are printed.

Another process in the printing of circuit boards involves inspection of the circuit boards after solder paste has been deposited on the surface of the circuit boards. Inspecting the circuit boards is important for determining that clean electrical connections can be made. An excess of solder paste can lead to shorts, while too little solder paste in appropriate locations can prevent electrical contact. Generally, the vision inspection system is further employed to provide a two-dimensional or a three-dimensional inspection of the solder paste on the circuit board.

One challenge facing the design of such stencil printers and dispensing systems is the ability to perform a fast, comprehensive inspection of a large area of a substrate after the disposition of solder paste in a single pass.

As is well known in the industry, a vision system, e.g., a machine vision camera may be utilized to capture images of a stencil and of a substrate for the purposes of performing alignment operations. In some prior art systems, such as U.S. Pat. No. 5,943,089, a single camera may be utilized to selectively capture images of either the underside of a stencil, or the top surface of a substrate. In such systems, a single camera may be configured to selectively view either of these objects to be imaged. The selection of which image is to be captured may be affected, for example, by energizing one of two sources of illumination.

In other prior art vision systems, a single camera may use optics to image both the stencil and the substrate within a single split field of view. Such a solution has the advantage of imaging both scenes simultaneously, but with the limitations of reduced fields of view.

SUMMARY OF THE DISCLOSURE

One aspect of the present disclosure is directed to a stencil printer for printing an assembly material on an electronic substrate. In one embodiment, the stencil printer comprises a frame, a stencil coupled to the frame, the stencil having apertures formed therein, a support assembly coupled to the frame, the support assembly being configured to support the electronic substrate in a print position beneath the stencil, a print head gantry coupled to the frame, a print head assembly supported by the print head gantry in such a manner that the print head assembly is configured to traverse the stencil during print strokes, the print head assembly including a print head having a squeegee blade assembly configured to roll solder paste along the stencil, and a vision system configured to obtaining images of the stencil and the electronic substrate. The vision system includes a housing, a dual camera assembly supported by the housing, and a prism assembly supported by the housing and configured with the dual camera assembly to provide a first optical path that looks vertically up at a bottom of the stencil and a second optical path that looks vertically down on the electronic substrate.

Embodiments of the stencil printer further may include configuring the dual camera assembly to have a bracket and a first lens and a second lens secured to the bracket, with the first lens and the second lens being spaced from each other and extending perpendicularly from the bracket. The dual camera assembly further may include a first programmed camera configured to obtain an image of the stencil via the first optical path through the first lens, and a second programmed camera configured to obtain an image of the electronic substrate via the second optical path through the second lens. The dual camera assembly further may include two heat sinks, with a first heat sink being secured to the first programmed camera by a first thermal pad and a second heat sink being secured to the second programmed camera by a second thermal pad. The prism assembly may include a support having a base and a retainer, and a prism structure that is positioned on the base and is secured in place with respect to the base when securing the retainer to the base, with the prism structure being configured to direct light along the first optical path to the stencil and to direct light along the second optical path to the electronic substrate, and to direct an image from the stencil along the first optical path to the first programmed camera via the first lens and an image from the electronic substrate along the second optical path to the second programmed camera via the second lens. The prism assembly further includes an optical window including a % waveplate, which is secured in place with respect to the retainer by a cover, with the optical window being placed over an opening formed in the cover through which the first optical path to the stencil travels. The base of the prism assembly may include an opening through which the second optical path to the electronic substrate travels. The prism assembly further may include a dual-sided LED board, which is configured to generate light from one side of the LED board and from an opposite side of the LED board. The LED board may include a first illuminator having a matrix of LED lights provided on one side of the LED board and a second illuminator having a matrix of lights provided on the opposite side of the LED board. The prism assembly further may include a third illuminator including an LED ring light to provide off-axis illumination to the electronic substrate along the second optical path. The prism structure may include a first arm section, a second arm section and a connector section. The first arm section may include three prisms arranged to form a generally rectangularly-shaped block structure, the second arm section includes three prisms arranged to form a generally rectangularly-shaped block structure, and the connector section includes two prisms arranged to form a cube, which is disposed between the first arm structure and the second arm structure to create a generally U-shaped prism structure. The stencil printer further may include a first printed circuit board configured to control the dual camera assembly and a second printed circuit board configured to control remaining components of the vision system. The stencil printer further may include a third printed circuit board configured to control illumination of the LEDs associated with the prism assembly. The first printed circuit board and the second printed circuit board may be separated from one another by standoffs, with the first and second printed circuit boards being co-planer with respect to each other when assembled within and secured to the housing. The stencil printer further may include a fan module provided at one end of the housing to cool the components of the vision system, including the dual camera assembly, the prism assembly, the printed circuit board and the second printed circuit board.

Another aspect of the present disclosure is directed to a vision system for use in a stencil printer configured to print an assembly material on an electronic substrate. In one embodiment, the vision system comprises a housing, a dual camera assembly supported by the housing and a prism assembly supported by the housing and configured with the dual camera assembly to provide a first optical path that looks vertically up at a bottom of a stencil and a second optical path that looks vertically down on an electronic substrate. Embodiments of the vision system may include configuring the dual camera assembly to have a bracket and a first lens and a second lens secured to the bracket, with the first lens and the second lens being spaced from each other and extending perpendicularly from the bracket. The dual camera assembly further may include a first programmed camera configured to obtain an image of the stencil via the first optical path through the first lens, and a second programmed camera configured to obtain an image of the electronic substrate via the second optical path through the second lens. The dual camera assembly further may include two heat sinks, with a first heat sink being secured to the first programmed camera by a first thermal pad and a second heat sink being secured to the second programmed camera by a second thermal pad. The prism assembly may include a support having a base and a retainer and a prism structure that is positioned on the base and is secured in place with respect to the base when securing the retainer to the base, with the prism structure being configured to direct light along the first optical path to the stencil and to direct light along the second optical path to the electronic substrate, and to direct an image from the stencil along the first optical path to the first programmed camera via the first lens and an image from the electronic substrate along the second optical path to the second programmed camera via the second lens. The prism assembly further includes an optical window including a % waveplate, which is secured in place with respect to the retainer by a cover, with the optical window being placed over an opening formed in the cover through which the first optical path to the stencil travels. The base of the prism assembly may include an opening through which the second optical path to the electronic substrate travels. The prism assembly further may include a dual-sided LED board, which is configured to generate light from one side of the LED board and from an opposite side of the LED board. The LED board may include a first illuminator having a matrix of LED lights provided on one side of the LED board and a second illuminator having a matrix of lights provided on the opposite side of the LED board. The prism assembly further may include a third illuminator including an LED ring light to provide off-axis illumination to the electronic substrate along the second optical path. The prism structure may include a first arm section, a second arm section and a connector section. The first arm section may include three prisms arranged to form a generally rectangularly-shaped block structure, with the second arm section including three prisms arranged to form a generally rectangularly-shaped block structure, and the connector section including two prisms arranged to form a cube, which is disposed between the first arm structure and the second arm structure to create a generally U-shaped prism structure. The vision system further may include a first printed circuit board configured to control the dual camera assembly and a second printed circuit board configured to control remaining components of the vision system. The vision system further may include a third printed circuit board configured to control illumination of the LEDs associated with the prism assembly. The first printed circuit board and the second printed circuit board may be separated from one another by standoffs, with the first and second printed circuit boards being co-planer with respect to each other when assembled within and secured to the housing. The vision system further may include a fan module provided at one end of the housing to cool the components of the vision system, including the dual camera assembly, the prism assembly, the printed circuit board and the second printed circuit board.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 4 is a top perspective view of a vision system of the stencil printer of an embodiment of the present disclosure;

FIG. 5 is a bottom perspective view of the vision system;

DETAILED DESCRIPTION OF THE DISCLOSURE

Figure 1:
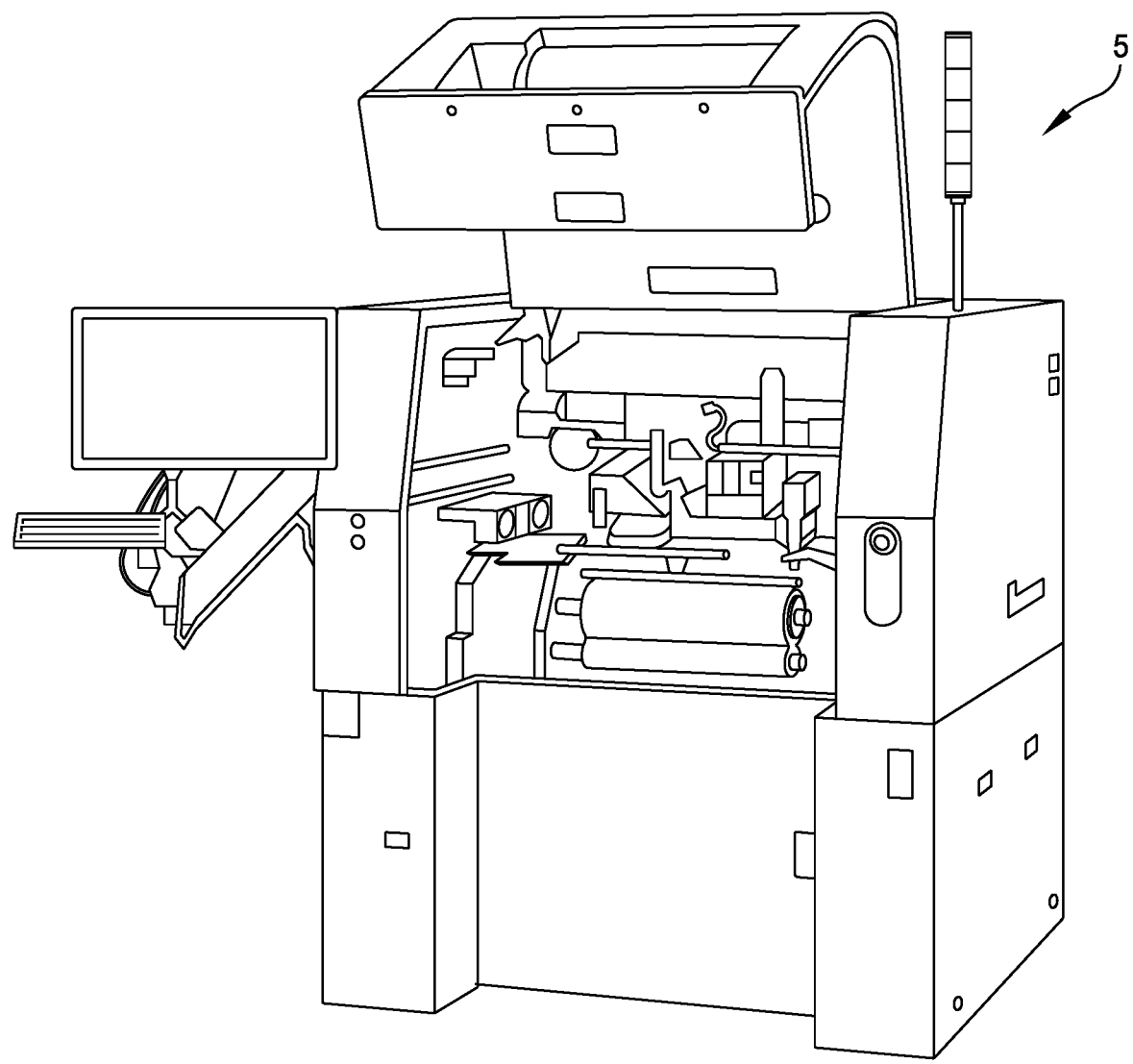
FIG. 1 is a front view of a stencil printer.

The present disclosure relates generally to material application machines (referred to herein as "stencil printers," "screen printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate. Specifically, embodiments of the present disclosure are described below with reference to stencil printers used to produce printed circuit boards.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

The present disclosure utilizes a specially configured prism assembly and two complete camera systems to facilitate simultaneously capturing full fields of view of both the stencil and the electronic substrate. The structure and functions of the prism assembly will now be described in further detail.

For purposes of illustration, embodiments of the present disclosure will now be described with reference to a stencil printer used to print an assembly material, such as solder paste, onto a circuit board. One skilled in the art will appreciate, however, that embodiments of the present disclosure are not limited to stencil printers that print solder paste onto circuit boards, but rather, may be used in other applications requiring dispensing of other viscous assembly materials, such as glues and encapsulents. For example, the apparatus may be used to print epoxy for use as underfill for chip-scale packages. Further, stencil printers in accordance with embodiments of the present disclosure are not limited to those that print assembly materials on circuit boards, but rather, include those used for printing other materials on a variety of substrates, such as semiconductor wafers. Also, the terms screen and stencil may be used interchangeably herein to describe a device in a printer that defines a pattern to be printed onto a substrate. In certain embodiments, the stencil printer may include a Momentum® or an Edison™ series stencil printer platform offered by ITW Electronic Assembly Equipment of Hopkinton, Massachusetts. An exemplary stencil printer is generally designated at 5 in FIG. 1. In this embodiment, the stencil printer 5 is a Momentum® series stencil printer platform offered by ITW Electronic Assembly Equipment of Hopkinton, Massachusetts.

Figure 2:
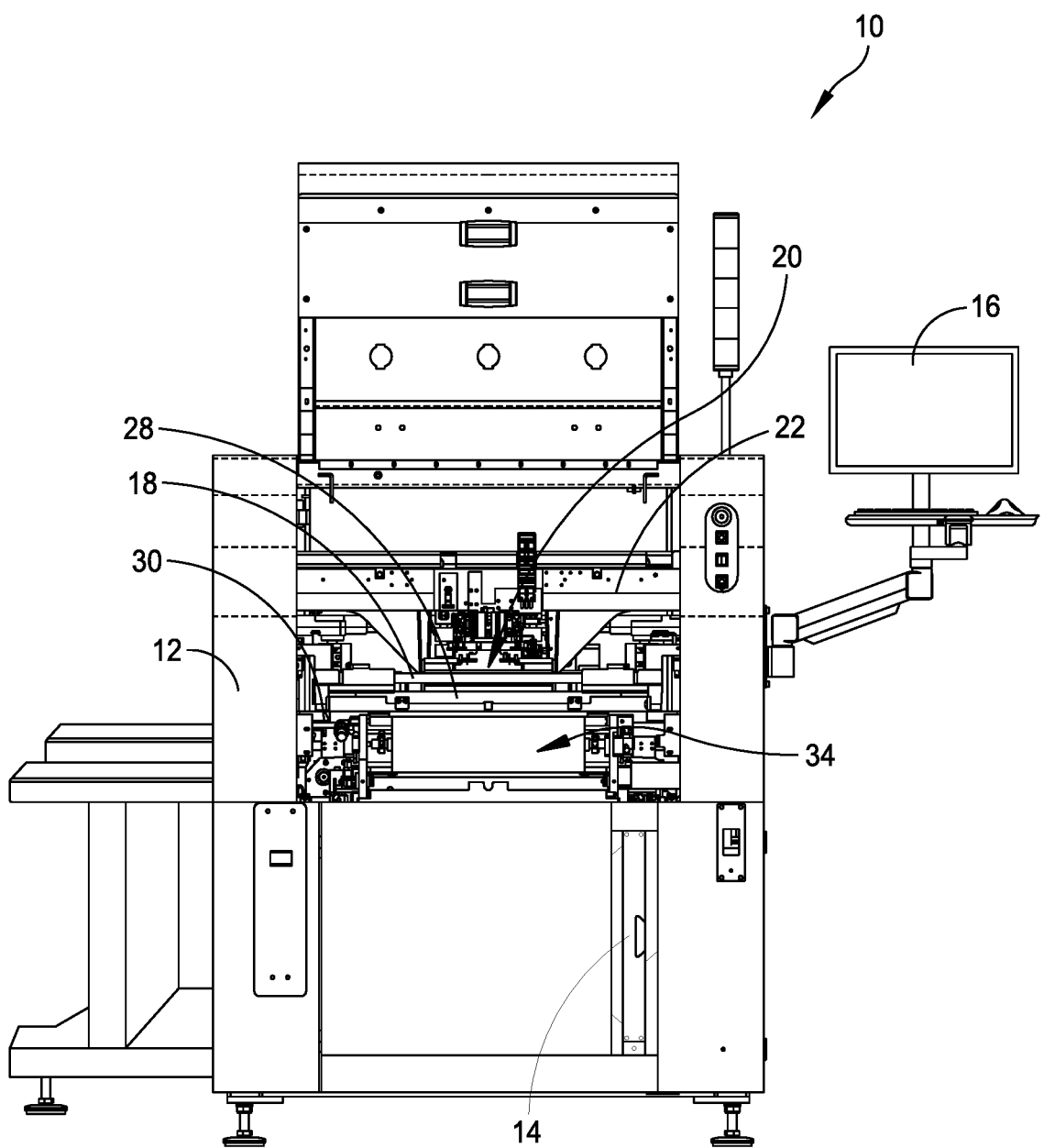
FIG. 2 is a front perspective view of a stencil printer.

Referring to FIG. 2, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head or print head assembly, generally indicated at 20, which is configured to apply the solder paste in a manner described in greater detail below.

As shown in FIG. 2 and described below, the stencil and the print head assembly may be suitably coupled or otherwise connected to the frame 12. In one embodiment, the print head assembly 20 may be mounted on a print head assembly gantry 22, which may be mounted on the frame 12. The print head assembly gantry 22 enables the print head assembly 20 to be moved in the y-axis direction under the control of the controller 14 and to apply pressure on the print head assembly as it engages the stencil 18. In a certain embodiment, the print head assembly 20 may be placed over the stencil 18 and may be lowered in the z-axis direction into contact and sealingly engage the stencil.

The stencil printer 10 may also include a conveyor system having rails (not shown) for transporting a printed circuit board to a print position in the stencil printer. The rails sometimes may be referred to herein as a "tractor feed mechanism," which is configured to feed, load or otherwise deliver circuit boards to the working area of the stencil printer, which may be referred to herein as a "print nest," and to unload circuit boards from the print nest.

Figure 3:
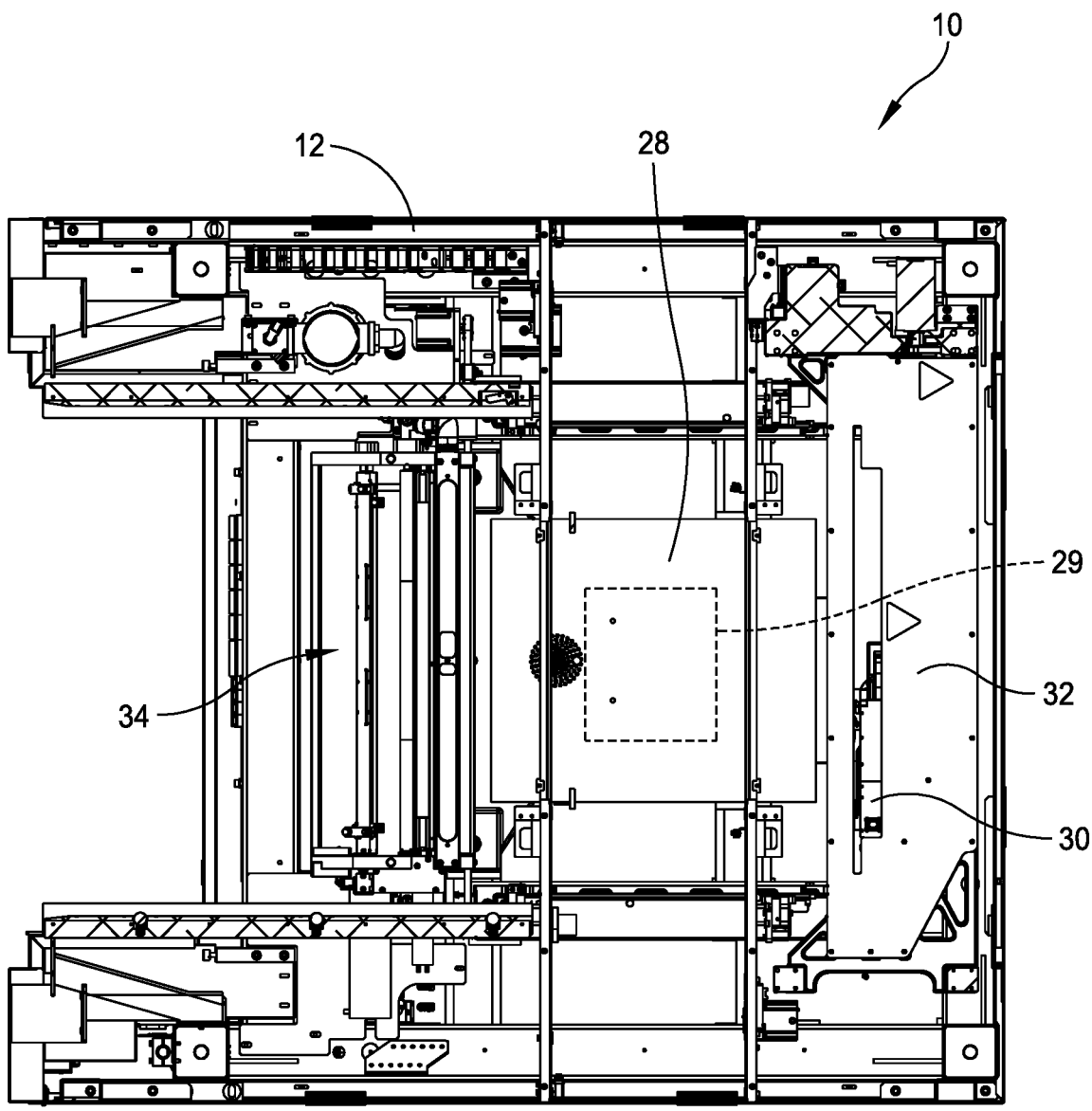
FIG. 3 is a top plan view of the stencil printer illustrated in FIG. 2 with portions removed.

Referring additionally to FIG. 3, the stencil printer 10 has a support assembly 28 to support the circuit board 29 (shown in dashed lines), which raises and secures the circuit board so that it is stable during a print operation. In certain embodiments, the substrate support assembly 28 further may include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head assembly 20 may be configured to receive solder paste from a source, such as a dispenser, e.g., a solder paste cartridge, which provides solder paste to the print head assembly during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft Windows® operating system provided by Microsoft Corporation, with application specific software to control the operation of the stencil printer 10. The controller 14 may be networked with a master controller that is used to control a production line for fabricating circuit boards.

In one configuration, the stencil printer 10 operates as follows. A circuit board 29 is loaded into the stencil printer 10 using the conveyor rails. The support assembly 28 raises and secures the circuit board 29 to a print position. The print head assembly 20 is then lowered in the z-axis direction until blades of the print head assembly contact the stencil 18 at a desired pressure. The print head assembly 20 is then moved in the y-axis direction across the stencil 18 by the print head assembly gantry 22. The print head assembly 20 deposits solder paste through apertures in the stencil 18 and onto the circuit board 29. Once the print head assembly has fully traversed the stencil 18 across the apertures, the print head assembly is lifted off the stencil and the circuit board 29 is lowered back onto the conveyor rails. The circuit board 29 is released and transported from the stencil printer 10 so that a second circuit board may be loaded into the stencil printer. To print on the second circuit board 29, the print head assembly is lowered in the z-axis direction into contact with the stencil and moved across the stencil 18 in the direction opposite to that used for the first circuit board.

A vision system 30 may be provided for the purposes of aligning the stencil 18 with the circuit board 29 prior to printing and to inspect the circuit board after printing. In one embodiment, the vision system 30 may be disposed between the stencil 18 and the support assembly 28 upon which a circuit board is supported. The vision system 30 is coupled to a vision system gantry 32 to move the vision system. In one embodiment, the vision system gantry 32 may be coupled to the frame 12, and includes a beam that extends between side rails of the frame 12 to provide back and forth movement of the imaging system 30 over the circuit board 29 in a y-axis direction. The vision system gantry 32 further may include a carriage device, which houses the vision system 30, and is configured to move along the length of the beam in an x-axis direction. The construction of the imaging gantry 32 used to move the vision system 30 is well known in the art of solder paste printing. The arrangement is such that the vision system 30 may be located at any position below the stencil 18 and above the circuit board 29 to capture an image of predefined areas of the circuit board or the stencil, respectively. In other embodiments, when positioning the imaging system outside the print position the imaging system may be located above or below the stencil and the circuit board.

The arrangement is such that the vision system 30 may be located at any position along a scan axis below the stencil 18 and above the circuit board 29 to determine topology of predefined areas of the circuit board or stencil, respectively. In other embodiments, when positioning the vision system 30 outside the printing nest, the vision system 30 may be located above or below the stencil 18 and the circuit board 29.

After one or more applications of the solder paste to circuit boards, excess solder paste may accumulate at the bottom of the stencil 18 and a stencil wiper assembly, generally indicated at 34, and may move beneath the stencil to remove the excess solder paste. In other embodiments, the stencil 18 may be moved over the stencil wiper assembly.

Embodiments of the present disclosure are directed to an improved vision system that is capable of providing two full fields of view for two cameras, respectively. In one embodiment, one camera is provided to look up at the stencil and the other camera is provided to look down at the electronic substrate. The vision system includes a prism assembly that provides two optical paths as collinear at the look up/look down points of view. Specifically, the prism assembly folds the two optical paths to be parallel at the lens/camera exit faces. In a certain embodiment, the prism assembly provides paths for on-axis lighting, as many of the metallic surfaces to be imaged are specular in nature.

Figure 6:
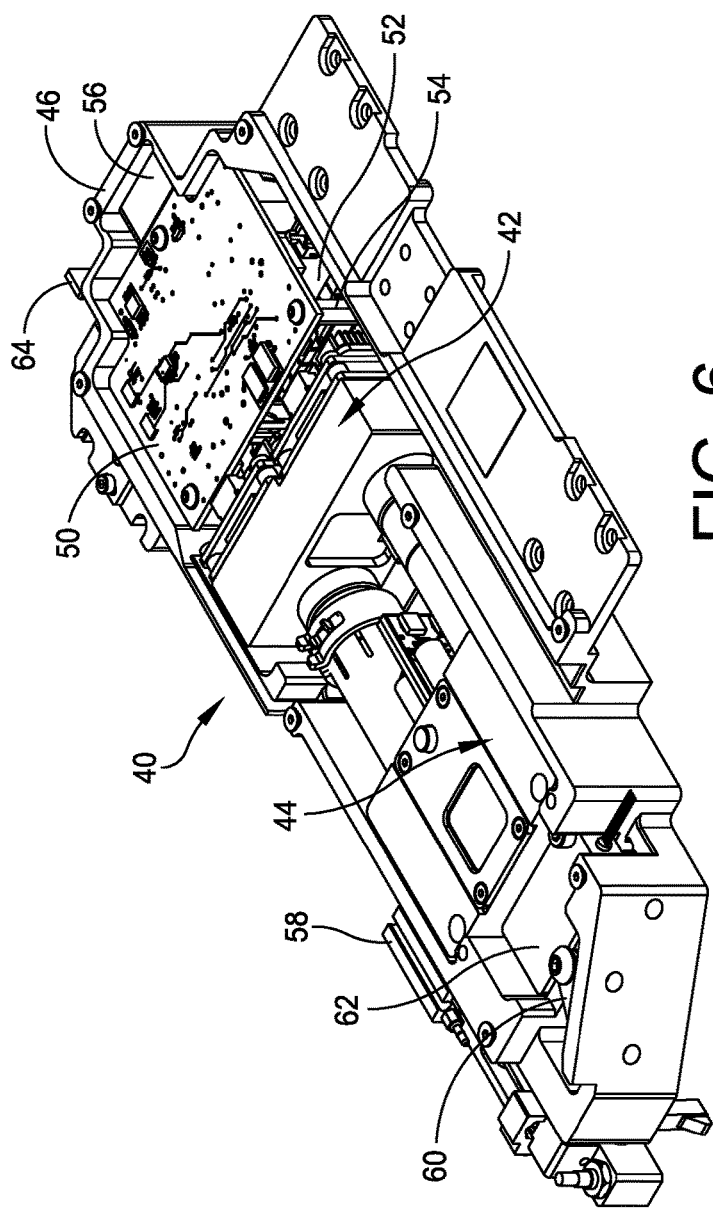
FIG. 6 is a top perspective view of the vision system with a cover removed to reveal components of the vision system.
Figure 7:
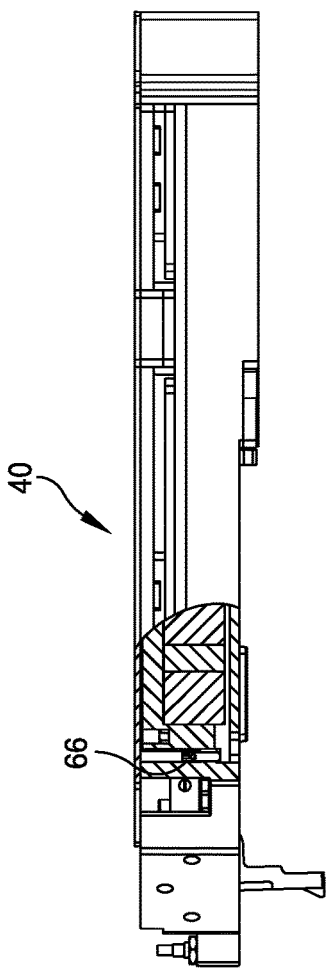
FIG. 7 is a side elevational view of the vision system.
Figure 8:
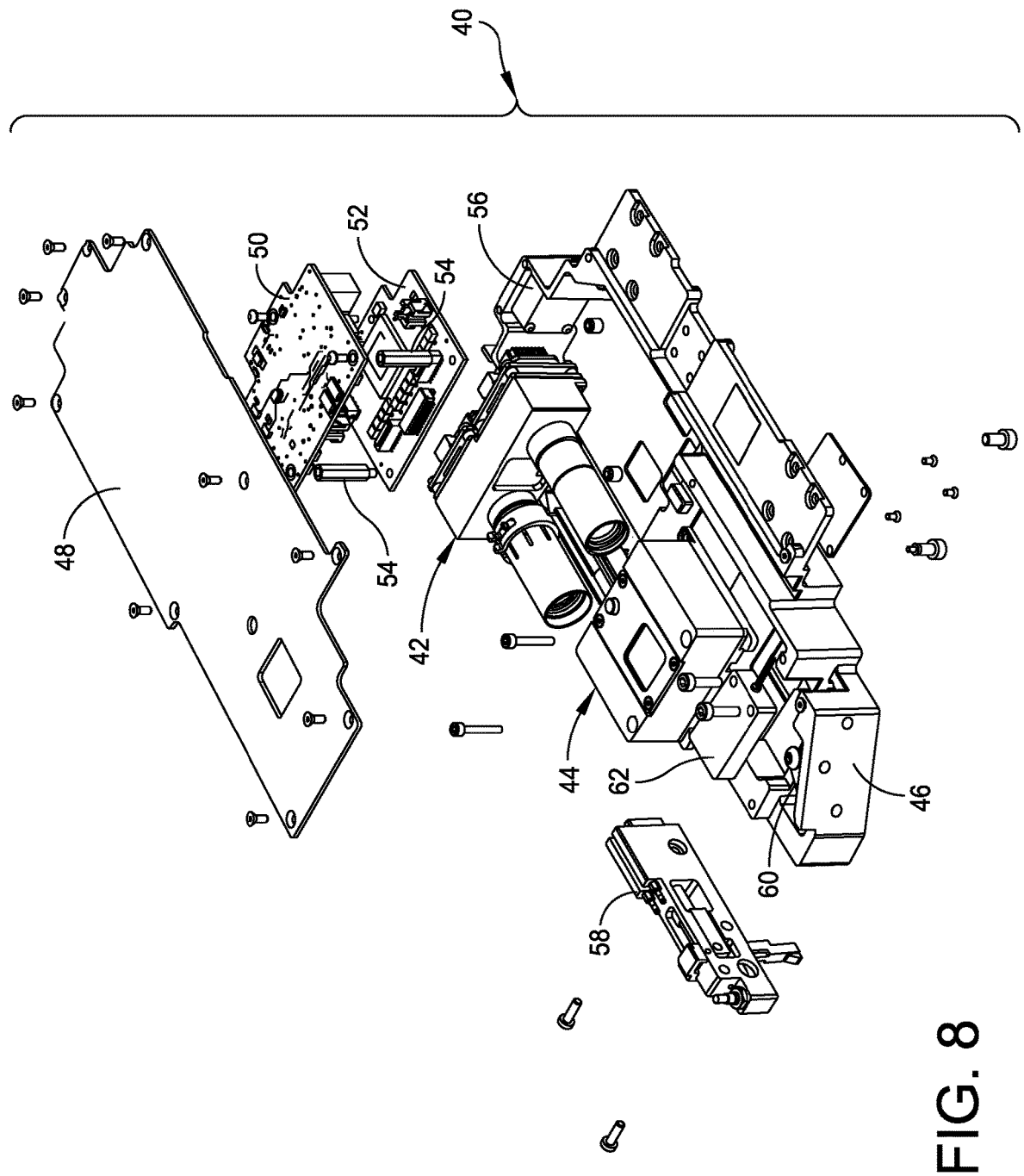
FIG. 8 is an exploded perspective view of the vision system.

Referring to FIGS. 4-8, and more particularly to FIGS. 6 and 8, a vision system of a preferred embodiment of the present disclosure is generally indicated at 40. The vision system 40 includes several major components, including a dual camera assembly, generally indicated at 42, and a prism assembly, generally indicated at 44. The vision system 40 includes a housing 46 configured to support the components of the vision system, including the dual camera assembly 42 and the prism assembly 44. A housing cover 48 is provided to enclose a top of the housing 46 and to protect the components of the vision system 40 supported by the housing, including the dual camera assembly 42 and the prism assembly 44. The dual camera assembly 42 and the prism assembly 44 are configured to operate with respect to one another to provide a first optical path that looks vertically up at the bottom of the stencil, e.g., stencil 18, and a second optical path that looks vertically down on an electronic substrate, e.g., circuit board 29.

The vision system 40 further includes a first printed circuit board 50, which is configured to provide control to the dual camera assembly 42, and a second printed circuit board 52, which is configured to provide control to the remaining components of the vision system. A third printed circuit board, which will be described in greater detail below, is provided to control illumination of the LEDs associated with the prism assembly 44. The first printed circuit board 50 and the second printed circuit board 52 are separated from one another by standoffs, each indicated at 54, with the first and second printed circuit boards being co-planer with respect to each other when assembled within and secured to the housing 46 of the vision system 40. The vision system 40 further includes a fan module 56 provided at one end of the housing 46 to cool the components of the vision system. The fan module 56 is provided to move air within the housing 46 to cool components supported by the housing, including but not limited to the dual camera assembly 42, the prism assembly 44 and the first and second printed circuit boards 50, 52.

The housing 46 of the vision system 40 further supports components of a hard stop assembly. For example, the housing 46 can be configured to support an actuator 58, a clamp 60, a sensor 62 and a flag 64. The hard stop assembly is provided to stop movement of the electronic substrate when loading the electronic substrate into the stencil printer. As shown, the housing 46 is configured to support the actuator 58 on a side of the housing with a pair of screw fasteners. The sensor 62 is supported by the housing 46 in a position next to the actuator 58 and the prism assembly 44. The sensor 60 and the prism assembly 44 also are secured to the housing 46 by screw fasteners as well. The sensor 62 referenced above is part of the hard stop assembly and can be actuated into a down position to engage an edge of the electronic substrate, or to a retracted up position. The sensor 62 ensures that the pneumatically actuated hard stop is positioned as commanded.

The dual camera assembly 42 is secured to the housing 46 adjacent the prism assembly 44, with a first camera being directed to one side of the prism assembly 44 and a second camera being directed to an opposite side of the prism assembly. The third circuit board referenced above is disposed between a gap provided in the prism assembly 44 and provides LED lighting to the prism assembly. The first and second printed circuit boards 50, 52 are secured to the housing 46 via screw fasteners secured to the standoffs 54 in a position adjacent to the dual camera assembly 42. As mentioned above, the fan module 56 of the vision system 40 is provided at the end of the housing 46 and configured to move air through the housing, specifically the first and second circuit boards 50, 52, the dual camera assembly 42 and the prism assembly 44, respectively.

The vision system 40 further includes a focus adjusting screw 66 (FIG. 7) and two springs, each indicated at 68 (FIG. 5) to maintain a light force on the focus adjusting screw to keep the dual camera assembly 42 as linear as possible while adjusting focus during calibration and setup.

Figure 9:
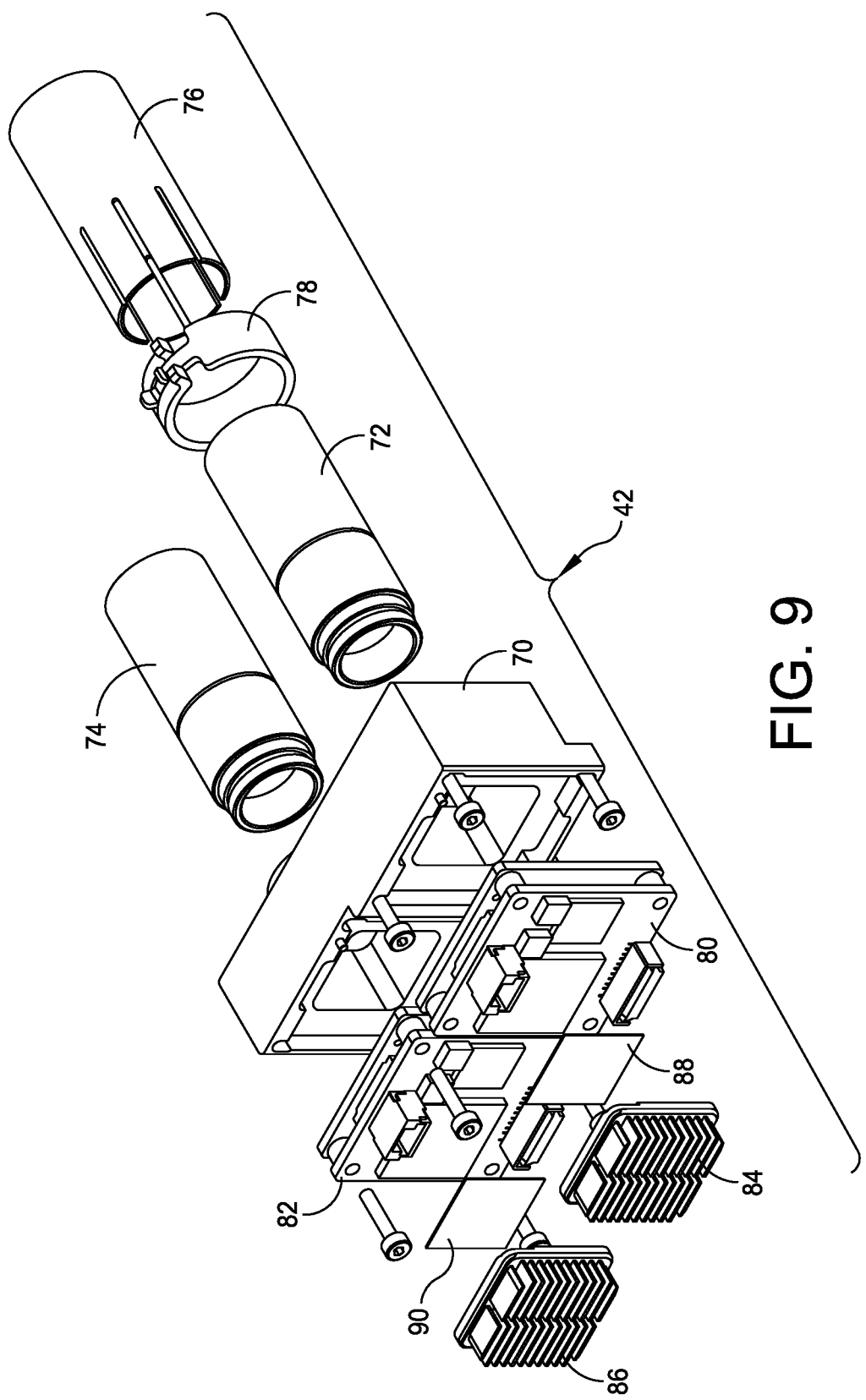
FIG. 9 is an exploded perspective view of a dual camera assembly of the vision system.

Referring to FIG. 9, the dual camera assembly 42 includes a bracket 70, which is configured to support the components of the dual camera assembly. The bracket 70 is a rectangularly-shaped structure that is configured to secure a first lens 72 and a second lens 74, which are spaced from each other and extend perpendicularly from the bracket. In the shown embodiment, the first lens 72 is configured to look up at the stencil and the second lens is configured to look down on the electronic substrate. One of the lenses, e.g., the first lens 72, includes a lens hood 76, which is secured to the second lens by a clamp 78. The purpose of the lens hood 76 is to prevent stray light from entering a camera, thereby preserving the image from the stencil. Although not shown, the second lens 74 can be configured to include a lens hood, similar to lens hood 76, which can be secured to the second lens by another clamp, similar to clamp 78. In a preferred embodiment, both the first lens 72 and the second lens 74 includes a lens hood, such as lens hood 76, to prevent stray light from entering its respective camera.

In some embodiments, two identical lenses 72, 74 are used. In one embodiment, each of the first lens 72 and the second lens 74 are manufactured by VST under model #MC075-50. The magnification of each of the first lens 72 and the second lens 74 is 0.75.

The dual camera assembly 42 further includes a first programmed camera 80 configured to obtain an image of the stencil via the first optical path through the first lens 72 and a second programmed camera 82 configured to obtain an image of the electronic substrate via the second optical path through the second lens 74. The arrangement is such that the dual camera assembly 42 is capable of obtaining simultaneous images of the stencil by the first programmed camera 80 and the first lens 72 and images of the electronic substrate by the second programmed camera 82 and the second lens 74. The dual camera assembly 42 further includes two heat sinks 84, 86, with a first heat sink 84 being secured to the first programmed camera 80 by a first thermal pad 88 and a second heat sink 86 being secured to the second programmed camera 82 by a second thermal pad 90. The first heat sink 84 and the second heat sink 86 are provided to cool the first programmed camera 80 and the second programmed camera 82, respectively.

In some embodiments, two identical programmed cameras 80, 82 are used. In one embodiment, the programmed cameras 80, 82 are manufactured by Teledyne FLIR under model #BFS-GE-50S5M-BD2, each incorporating a monochrome sensor manufactured by Sony under model number IMX264. In a certain embodiment, resolution of each programmed camera 80, 82 is 2464 (H)×2056 (V), for approximately 5.07 M pixels. Pixel size at the image sensors is 3.45 μm by 3.45 μm. In a certain embodiments, the programmed cameras 80, 82 are connected by Gigabit Ethernet and a three-port Broadcom GbE-Net switch can be provided as part of the vision system 40.

Figure 10:
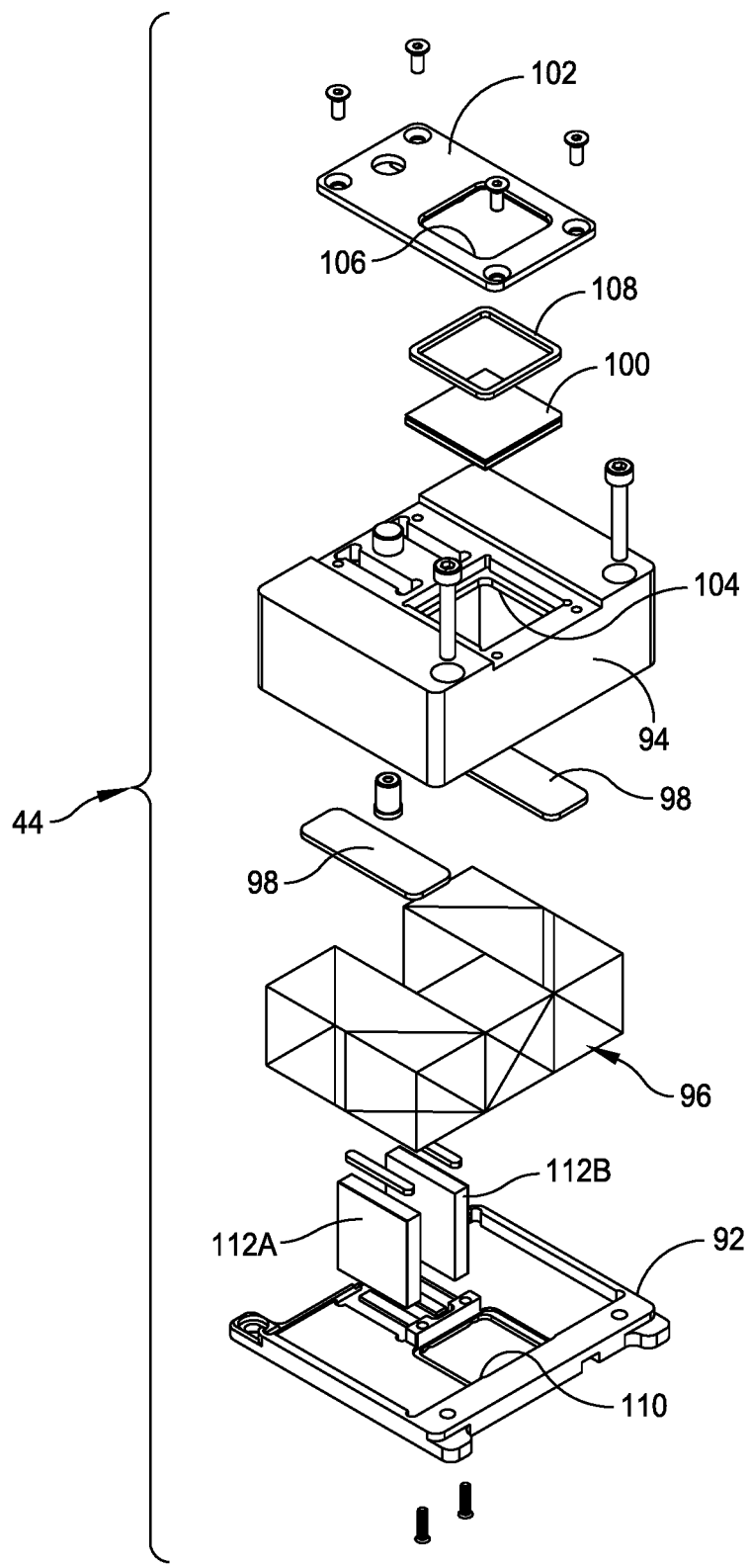
FIG. 10 is an exploded perspective view of a prism assembly of the vision system.

Referring to FIG. 10, the prism assembly 44 includes a support having a base 92 and a retainer 94, which are configured to be secured together to secure the components of the prism assembly. The components of the prism assembly 44 are supported on the base 92 and protected by the retainer 94 once assembled. The prism assembly 44 further includes a prism structure, generally indicated at 96, which is positioned on the base 92 and is secured in place with respect to the base when securing the retainer 94 to the base. The prism structure 96 is configured to direct light along the first optical path to the stencil and to direct light along the second optical path to the electronic substrate, which is sometimes referred to as an object. The prism structure 96 further is configured to direct an image from the stencil along the first optical path to the first programmed camera 80 via the first lens 72 and an image from the electronic substrate along the second optical path to the second programmed camera 82 via the second lens 74. As mentioned above, the first lens 72 includes the lens hood 76 to prevent stray light from compromising the image taken of the stencil and directed to the first programmed camera 80. As mentioned above, the second lens 74 can be configured with a lens hood as well.

The prism assembly 44 further includes two self-adhesive foam pads, each indicated at 98, that are provided to engage the prism structure 96 when securing the retainer 94 to the base 92. The retainer 94 of the prism assembly 44 further includes an optical window 100, within which is a ¼ waveplate is embedded. The ¼ waveplate is secured in place with respect to the retainer 94 by a cover 102, with the optical window being placed over an opening 104 formed in the retainer. In one embodiment, the ¼ waveplate is a thin film. Accordingly, for mounting and handling purposes, the ¼ waveplate is laminated between two thin layers of glass, creating a window assembly that can be handled and mounted as a single, unitary piece. The window 100 can be referred to as a ¼ waveplate assembly. The orientation of the ¼ waveplate is somewhat critical to its function. The alignment between the ¼ waveplate and the edges of the glass window ensures proper position of the ¼ waveplate. Further, while this embodiment describes one such window within the stencil-side optical path, the same window with ¼ waveplate may be utilized on the substrate-side optical path to enhance the contrast of any specular feature that may be present on the electronic substrate, e.g., exposed copper pads on the electronic substrate.

The cover 102 includes an opening 106, which is aligned with opening 104 of the retainer 94 to allow light to travel from the prism assembly 44 to the stencil. The optical window 100 is provided for the first optical path to the stencil. The cover 102 is secured to the retainer 94 by screw fasteners, and can include a gasket 108 to position and seal the optical window 100 in place.

The base 92 of the prism assembly 44 includes an opening 110 through which the second optical path to the electronic substrate travels. The opening 110 of the base 92 does not require a filter; however, should a filter be required, the base can support an optical window, similar to the optical window 100, the cover 102 and the gasket 108 used on the retainer 94.

The prism assembly 44 further includes two laminated polarizer on diffuser structures, indicated at 112A, 112B, which are installed with the polarizers facing the prism structure 96. The purpose of the diffuser structures 112A, 112B is to help ensure the light generated by the illuminator LED matricies 116, 118 is spatially uniform. By diffusing the light as it passes through the diffuser, the structure of the light, specifically the brighter areas where the LEDS are and the thin dark bands between the individual LEDs are averaged out to ensure a more uniform illumination across the entrance faces, e.g., surfaces 152, 154 described below, of the prism. The polarizers laminated to the diffusers 112A, 112B ensure that only S-plane polarized light enters the prism, as only the S-plane polarized light will be directed onto the optical axis by polarizing surfaces, e.g., surfaces 136, 150 described below, within the prism. Accordingly, any P-plane polarized light from the illuminators is undesirable and thus blocked by the polarizers.

Figure 11A:
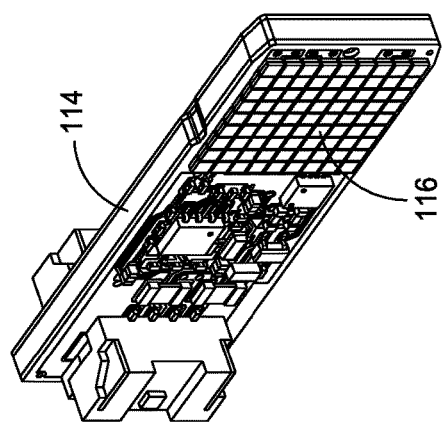
FIGS. 11A and 11B are perspective views of an LED board assembly.
Figure 11B:
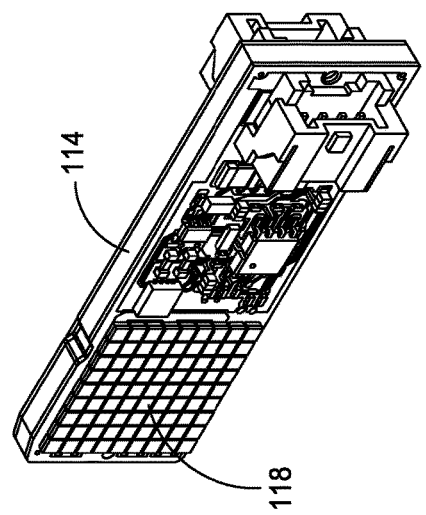
Figure 13D:
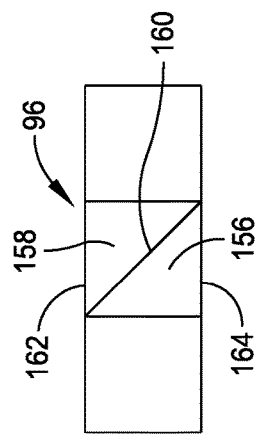
FIGS. 13A-13F are views of the prism assembly with packaging removed.
Figure 13C:
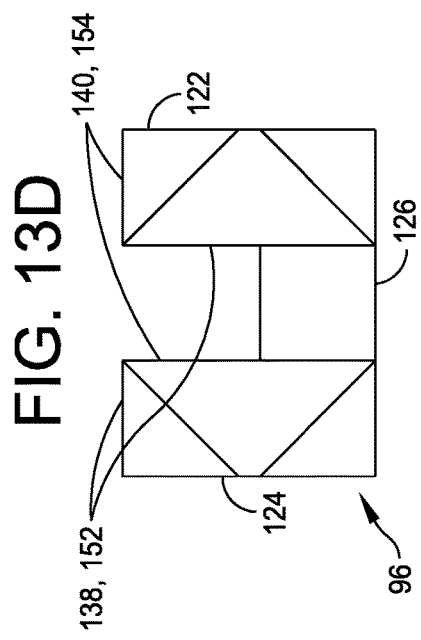
Figures 13E, 13F:
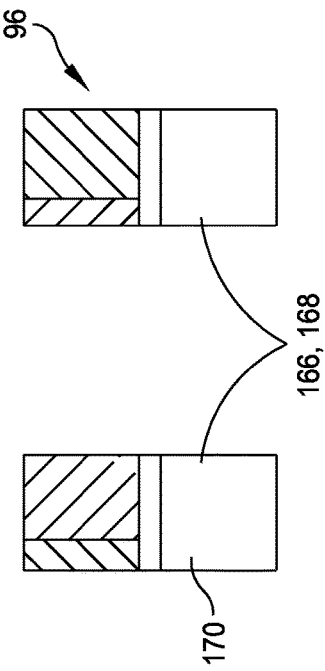
Figure 13A:
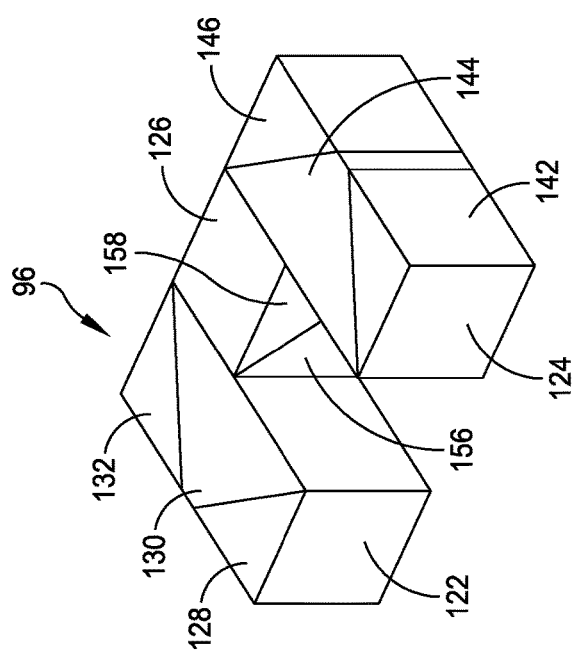
Figure 13B:
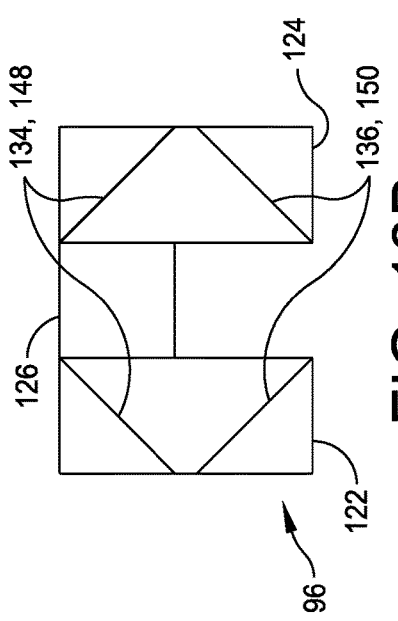

Referring to FIGS. 11A and 11B, the prism assembly 44 further includes a dual-sided LED board 114, which is provided to provide light to the vision system 40. As shown, the LED board 114 is configured to generate light from one side of the LED board and from an opposite side of the LED board. Specifically, a first matrix of LED lights 116 is provided on one side of the LED board 114 and a second matrix of lights 118 is provided on the opposite side of the LED board. In one embodiment, the dual-sided LED board 114 can be assembled by placing two separate LED boards back-to-back with one another in the manner shown in FIG. 12A.

In some embodiments, each matrix of the LED lights 116, 118 consists of 81 Cree XD16 LEDs arranged physically in a 9 by 9 array. Each set of 81 LEDs is electrically connected as three parallel strings of 27 LEDs each. The matrices of LED lights 116, 118 providing on-axis lighting for both the stencil and electronic substrate include use 3000 K white LEDs.

In one embodiment, the prism assembly 44 further includes a third illuminator including an LED ring light 120 to provide off-axis illumination to the electronic substrate along the second optical path. The LED ring light 120 is shown in FIG. 5. The LED ring light 120, sometimes referred to as an off-axis light source, consists of 32 LEDs arranged in a ring, with eight LEDs along each side of a square. Electrically, the LEDs of the LED ring light 120 are connected as a single string of 32 LEDs. The LED ring light providing off-axis light includes red LEDs.

In some embodiments, a drive circuitry for the LED lights may reside on the LED board 114. A drive circuitry for the LED ring light 120 may reside on an interconnect board. In one embodiment, the first and second programmed cameras 80, 82 each provide three General Purpose Input Output (GPIO) signals. The first programmed camera 80 used to view the stencil provides one output signal as a strobe (on-axis), and a second output signal as a TRIGGER_ENABLE. The second programmed camera 82 used to view the electronic substrate provides two output signals as strobes (on-axis and off-axis, respectively). The actual TRIGGER signal is created by ANDing the TRIGGER_ENABLE with a motion control output called XY_IN_POS. In the event of not performing on-the-fly triggering, the XY_IN_POS signal should be asserted to allow the TRIGGER_ENABLE to pass through to the TRIGGER. The TRIGGER signal is fed back into both the first programmed camera 80 and the second programmed camera 82 on their third GPIO signals configured as inputs. This configuration allows both the first and second programmed cameras 80, 82 to be triggered simultaneously.

In some embodiments, strobes for the three different illuminators, i.e., the two matrices of LED lights 116, 118 of the LED board 114 and the one LED ring light 120 are independent from each other, and the effective illumination may be controlled by varying the duration of the respective strobes.

In some embodiments, the LEDs of the LED board 114 and the LED ring light 120 are controlled to run at 1 Ampere (A). This current level is substantially higher than the continuous rated current. As such, the strobe duration should be limited to prevent the LEDs from overheating. In one embodiment, strobe durations can be less than 100 microseconds (µs), typically 30-50 µs.

Figure 12A:
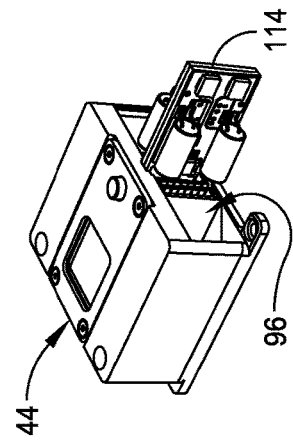
FIGS. 12A-12C are perspective views showing the installation of the LED board assembly in the prism assembly.
Figure 12B:
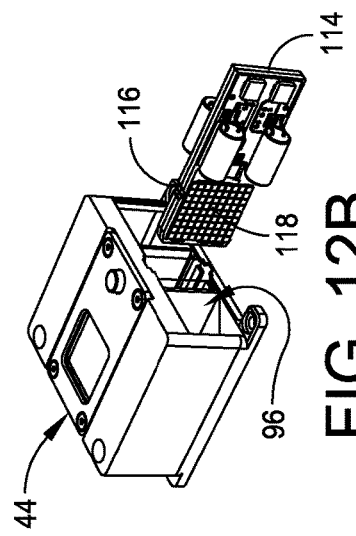
Figure 12C:
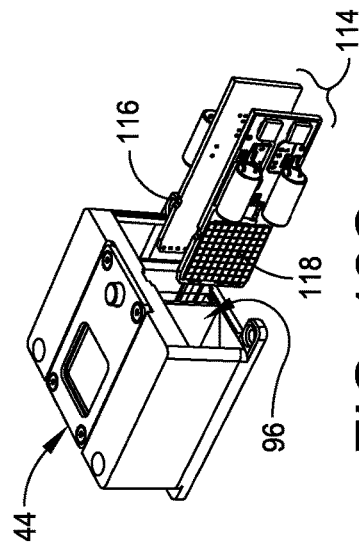

As shown in FIGS. 12A-12C, the LED board 114 is installed within the prism structure 96 of the prism assembly 44 by inserting the LED board within a gap or space provided in the prism structure. As shown in FIG. 12A, two separate LED boards are positioned back-to-back with one another with the first matrix of LED lights 116 being directed in one direction and the second matrix of LED lights 118 being directed in an opposite direction. FIG. 12B illustrates the LED board 114 prior to insertion within the gap formed in the prism structure 96 of the prism assembly 44. FIG. 12C illustrates the LED board 114 installed within the prism structure 96 of the prism assembly 44.

Referring to FIGS. 13A-13F, the prism structure 96 of the prism assembly 44 in the shown embodiment is generally U-shaped in construction and embodies several conjugated prisms secured to one another to achieve the desired, shown U-shaped prism structure. As is known in optics, a prism is a transparent optical element having flat, polished surfaces that are designed to refract light. In the shown embodiment, several triangular prisms are used. The prisms can be fabricated from optical glass, or some other suitable material that is transparent to the wavelengths for which the prisms are designed. Other materials can include acrylic and fluorite.

The prism structure 96 can be broken down into three sections, a first arm section 122, a second arm section 124 and a connector section 126. The first arm section includes 122 three prisms 128, 130, 132 arranged to form a generally rectangularly-shaped block structure. Enhanced aluminum is provided on internal surface 134. Polarized, S-plane reflected, P-plane transmitted material is provided on internal surface 136. Broadband visible anti-reflection (AR) coatings are used on surfaces 138, 140. Similarly, the second arm section 124 includes three prisms 142, 144, 146 arranged to form a generally rectangularly-shaped block structure. The second arm section 124 is a mirror image of the first arm section 122. Enhanced aluminum is provided on internal surface 148. Polarized, S-plane reflected, P-plane transmitted material is provided on internal surface 150. Broadband visible AR coatings are used on surfaces 152, 154. The connector or middle section 126 includes two prisms 156, 158 arranged to form a cube. Enhanced aluminum is provided on internal surface 160. Broadband visible AR coatings are used on surfaces 162, 164. Further, broadband visible AR coatings may be used on inwardly facing surfaces 166, 168 of the first arm section 122 and the second arm section 124, respectively. And finally black paint is used on surface 170 as well as many other non-optical surfaces. It should be noted that the small triangular prisms 132, 146 in FIG. 13A may not be optically active. The prism structure 44 would be difficult to assemble and secure if these small prisms were not present. Accordingly, some of the smaller triangular prisms have been added for mechanical reasons rather than optical.

The presence of the polarizer mounted to the output face of the diffuser and the polarizing surface that is internal to the prism structure 44 work in conjunction with one another to steer the light from the illuminator onto the main optical centerline path. If it were not for the ¼ waveplate, the light reflected back from the stencil would still be largely S-plane polarized, and thus, upon encountering the polarizing surface with the prism, would be reflected back towards the illuminator instead of passing through towards the camera. Accordingly, the ¼ waveplate is provided as part of the beam-steering function of the prism assembly. On the substrate side, since the non-specular surfaces do not maintain the polarized structure of the light, the ¼ waveplate is less critical. The light returning from the substrate-side image is a combination of S-plane and P-plane polarized light. The P-plane portion passes through the polarizing surface towards the camera and lens. The S-plane portion of the light is reflected back towards the illuminator and is lost. As noted above, the ¼ waveplate window may be incorporated in the stencil-side optical path as well, helping to increase the contrast of any specular features that may be present in the substrate scene.

Embodiments of the prism structure 96 of the prism assembly 44 may include providing all optical surfaces of the prism structure flat to ¼ wave, all optical surfaces finished to 40-20 Scratch/Dig (S/D), all linear dimensions ±0.10 mm, and all angles ±3 minute of arc (0° 03').

In some embodiments, an effective pixel size at the stencil (object) is 3.45 μm/0.75=4.60 μm. Fields of view of the stencil and the electronic substrate are 11.33 mm (H) by 9.46 mm (V).

The illumination does roll off slightly at the edges of the field of view. Accordingly, a Region Of Interest (ROI) slightly small than the full field of view may be warranted.

As indicated above, the first optical path provided to the stencil has only on-axis illumination, as the surface of a stencil is substantially specular in nature. However, the second optical path for the electronic substrate incorporates both on-axis and off-axis lighting.

Figure 14A:
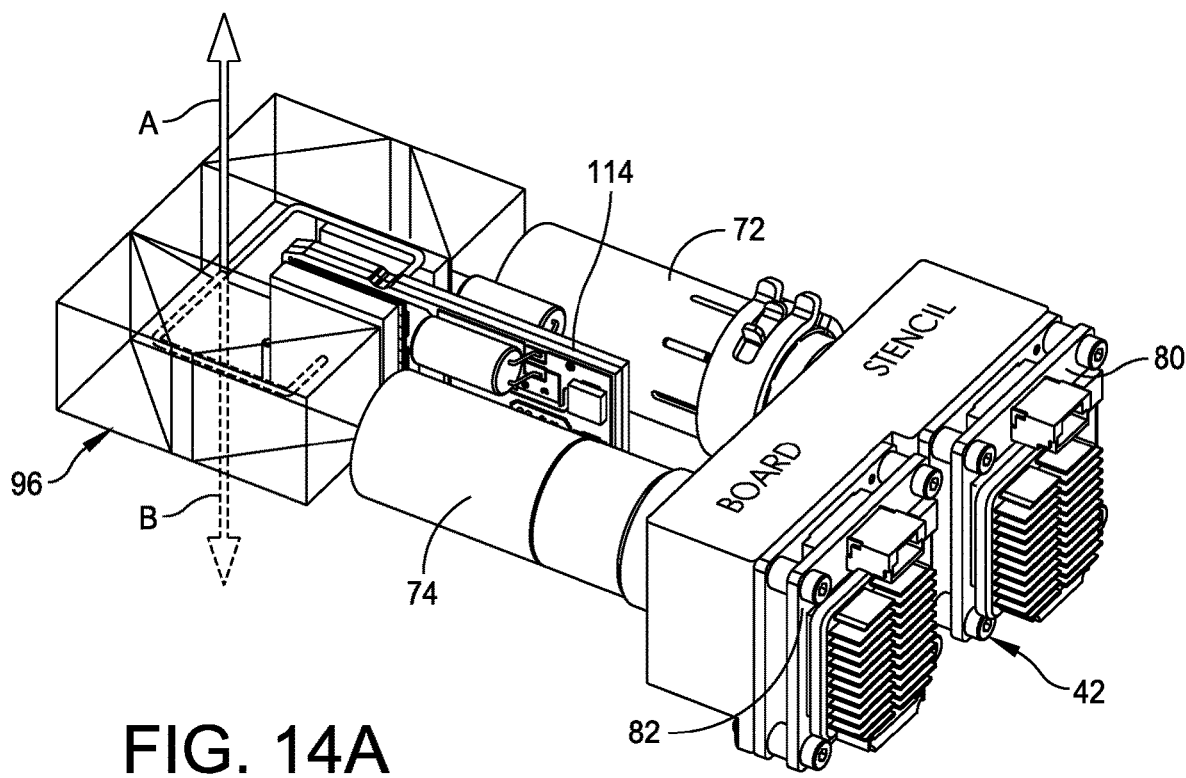
FIG. 14A is a perspective view of the dual camera assembly of the vision system showing an optical path of illumination generated by the vision system and directed to a stencil and an electronic substrate.
Figure 14B:
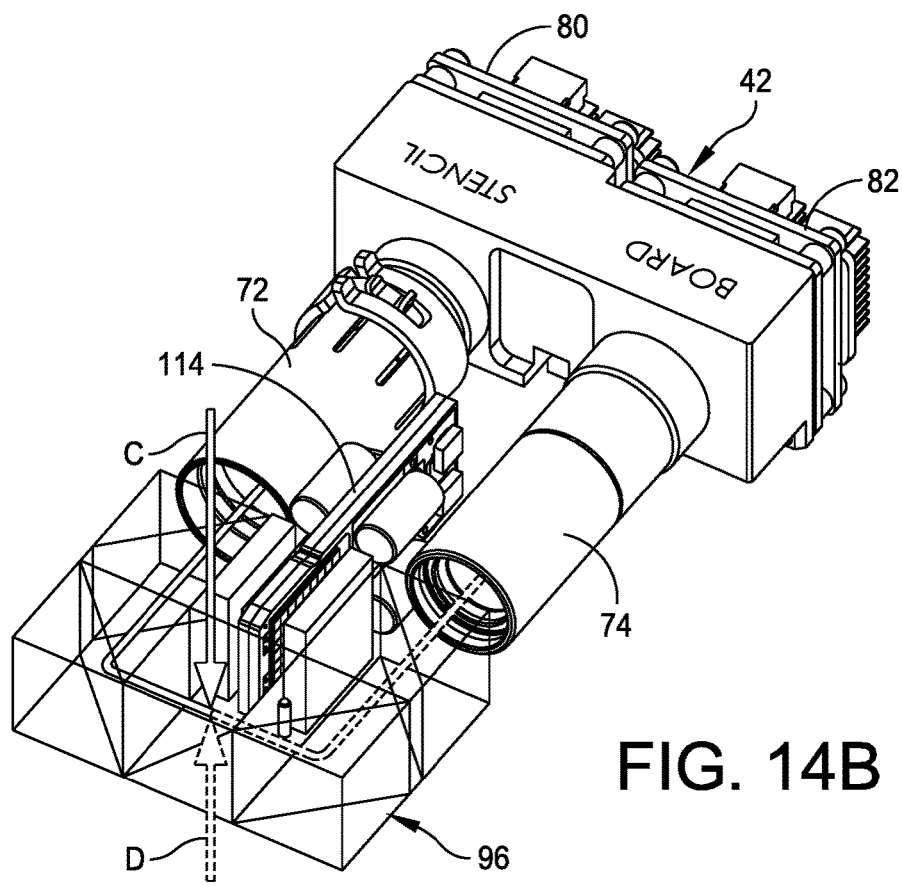
FIG. 14B is a perspective view of the dual camera assembly of the vision system showing an optical path of images from the stencil and the electronic substrate.

Referring to FIG. 14A, as mentioned above, the prism structure 96 of the prism assembly 44 allows simultaneous illumination to be directed from the LED board 114 along the first optical path (designated A in FIG. 14A) and the second optical path (designated B in FIG. 14A) to the stencil and the electronic substrate, respectively. Referring to FIG. 14B, images to be reflected back along the first optical path (designated C in FIG. 14B) and the second optical path (designated D in FIG. 14B) to the first programmed camera 80 and to the second programmed camera 82, respectively. The construction of the prism structure 96 can be varied depending on its intended use.

The first and second optical paths are substantially collinear. The two optical paths are each folded 90° at a common internal aluminized surface 160, which is oriented at 45° to the optical paths, and emerge with the two paths horizontally opposed. The two horizontal paths are each folded 90° at aluminized surfaces 134, 148 and emerge along parallel paths. In the preferred embodiment, these two optical paths are separated by 32 millimeters (mm).

As described above, the vision system 40 includes the two-sided LED board 114 located within the U-shaped gap in the prism structure 96 of the prism assembly 44 to provide illumination to the vision system. The first matrix of LED lights 116 of the LED board 114 and the second matrix of LED lights 118 of the LED board direct light into the first optical path and into the second optical path, respectively. The prism structure 96 of the prism assembly 44 includes polarizer films, which are bonded to the exit faces of diffusers 112A, 112B, restricting light entering the prism assembly to S-plane polarization. An internal surface within each arm portion 122, 124 of the prism structure 96 is coated with a dielectric layer fabricated to preferentially reflect S-Plane polarized light. Since these internal faces are oriented at 450 to the optical axis, the S-Plane polarized light is directed on-axis along each of the two optical paths.

After each optical path passes through the two fold mirrors, the illumination light passes through ¼ wave retarder films, embedded within a window and mounted adjacent the prism structure 96 and emerges as circularly polarized light directed at the object surfaces. Although not shown, a substrate-side ¼ waveplate may be provided.

Light reflected from the illuminated object surfaces reflects back into the prism structure 96. The light that reflects from specular surfaces will maintain the circular polarization. After passing a second time through the ¼ wave retarder films, the light enters the prism structure 96 as P-plane plane polarized light. In the present embodiment, the substrate-side optical path has not been fitted with a ¼ waveplate window, since most electronic substrates are not particularly specular. However, since some features of the substrate, such as bonding pads, may themselves be specular, the inclusion of a substrate-side ¼ waveplate window, the presence of which may enhance the contrast of such specular features, also may be included.

When the light passes through the internal polarizing surface, the P-Plane is transmitted through, and exits the prism structure 96 towards the imaging lenses 72, 74. Any light that is not P-plane polarized (i.e. S-plane polarized) will be reflected away from the optical axis at the internal surface.

In some embodiments, the vision system 40 utilizes a single, two sided LED board 114. In other embodiments, the vision system utilizes two separate one-sided LED boards mounted back-to-back.

In some embodiments, the illumination generated by the LED board 114 is managed to maximize the signal-to-noise ratio between the meaningful structured light and any unwanted or non-image light.

In some embodiments, a prism structure 96 of the assembly 44 is intended to manage illumination and image paths for a dual-camera system in an automated stencil printer. The two optical paths are collinear and 180° opposed on the object side, and parallel on the image side. In one embodiment, the prism structure 96 of the prism assembly 44 assembly is 48 mm in width by 35 mm in length by 16 mm in height.

As described above, the purposes of the prism assembly 44 of the vision system 40 are manifold. The prism assembly 44 provides two full fields of view to two cameras, i.e., first and second programmed cameras 80, 82 one looking up at the stencil, and another looking down at the electronic substrate. Further, the prism assembly 44 provides two optical paths as collinear at the look up/look down point.

In some embodiments, the two optical paths are folded to be parallel at the lens/camera exit faces.

In some embodiments, the prism assembly 44 of the vision system 40 is configured to provide illumination paths for on-axis lighting, as many of the metallic surfaces to be imaged are specular in nature.

In some embodiments, the prism assembly 44 of the vision system 40 is configured to manage the illumination to maximize the signal-to-noise ratio between the meaningful structured light and any unwanted or non-image light.

In operation, the vision system 40 is configured to "look up" vertically along the first optical path at the bottom of the stencil and simultaneously "look down" vertically along a second optical path at the electronic substrate. In some embodiments, illumination is generated by the two-sided LED board 114 located within the U-shaped gap in the prism structure 96 of the prism assembly 44. A first face, e.g., matrix 116, of the LED board 114 directs light through diffuser polarizer 112A into the first optical path, and a second face, e.g., matrix 118, of the LED board directs light through diffuser/polarizer 112B into the second optical path. Polarizing films are bonded to the diffuser output faces, restricting light to S-plane polarization. The internal surface within each arm portion 122, 124 of the prism structure 96 is coated with a dielectric layer fabricated to preferentially reflect S-Plane polarized light. Since these internal faces are oriented at 45° to the optical axis, the S-Plane polarized light is directed on-axis along each of the two optical paths. After passing through the two fold mirrors, the illumination light passes through ¼ wave retarder films, laminated within windows and mounted adjacent to the prism and emerges as circularly polarized light directed at the object surfaces. Light reflected from the illuminated object surfaces reflects back through the ¼ waveplates and back into the prism structure 96. The light that reflects from specular surfaces will maintain the circular polarization. After passing a second time through the ¼ wave retarder films, the light enters the prism structure 96 as P-plane plane polarized light. When the light passes through the internal polarizing surface, the P-plane is transmitted through, and exits the prism structure 96 towards the imaging lenses 72, 74. Any light that is not P-plane polarized (i.e., S-plane polarized) will be reflected away from the optical axis at the internal surface.

Various controllers, such as the controller 14, may execute various operations discussed above. Using data stored in associated memory and/or storage, the controller 14 also executes one or more instructions stored on one or more non-transitory computer-readable media, which the controller 14 may include and/or be coupled to, that may result in manipulated data. In some examples, the controller 14 may include one or more processors or other types of controllers. In one example, the controller 14 is or includes at least one processor. In another example, the controller 14 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above.

The computer-program product may be, or include, one or more controllers and/or processors configured to execute instructions to perform methods, processes, and/or operations discussed above.

Systems and methods of the present disclosure are directed to capturing images of topographical features of the stencil and of the electronic substrate. The description of the systems and methods provided herein reference exemplary electronic substrates (e.g., printed circuit boards), which are supported on the support assembly of the stencil printer.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A stencil printer for printing an assembly material on an electronic substrate, the stencil printer comprising:
    a frame;
    a stencil coupled to the frame, the stencil having apertures formed therein;
    a support assembly coupled to the frame, the support assembly being configured to support the electronic substrate in a print position beneath the stencil;
    a print head gantry coupled to the frame;
    a print head assembly supported by the print head gantry in such a manner that the print head assembly is configured to traverse the stencil during print strokes, the print head assembly including a print head having a squeegee blade assembly configured to roll solder paste along the stencil; and
    a vision system configured to obtain images of the stencil and the electronic substrate, the vision system including
        a housing,
        a dual camera assembly supported by the housing, the dual camera assembly including a bracket, a first lens and a second lens secured to the bracket, the first lens and the second lens being spaced from each other and extending perpendicularly from the bracket, the dual camera assembly further including a first programmed camera configured to obtain an image of the stencil via the first optical path through the first lens and a second programmed camera configured to obtain an image of the electronic substrate via the second optical path through the second lens, and
        a prism assembly supported by the housing and configured with the dual camera assembly to provide a first optical path that looks vertically up at a bottom of the stencil and a second optical path that looks vertically down on the electronic substrate, the prism assembly including
            a support having a base and a retainer, and
            a prism structure that is positioned on the base and is secured in place with respect to the base when securing the retainer to the base, the prism structure being configured to direct light along the first optical path to the stencil and to direct light along the second optical path to the electronic substrate, and to direct an image from the stencil along the first optical path to the first programmed camera via the first lens and an image from the electronic substrate along the second optical path to the second programmed camera via the second lens.

2. The stencil printer of claim 1, wherein the dual camera assembly further includes two heat sinks, a first heat sink being secured to the first programmed camera by a first thermal pad and a second heat sink being secured to the second programmed camera by a second thermal pad.

3. The stencil printer of claim 1, wherein the prism assembly further includes an optical window including a ¼ waveplate, which is secured in place with respect to the retainer by a cover, with the optical window being placed over an opening formed in the cover through which the first optical path to the stencil travels.

4. The stencil printer of claim 3, wherein the base of the prism assembly includes an opening through which the second optical path to the electronic substrate travels.

5. The stencil printer of claim 1, wherein the prism assembly further includes a dual-sided LED board, which is configured to generate light from one side of the LED board and from an opposite side of the LED board.

6. The stencil printer of claim 5, wherein the LED board includes a first illuminator having a matrix of LED lights provided on one side of the LED board and a second illuminator having a matrix of lights provided on the opposite side of the LED board.

7. The stencil printer of claim 6, wherein the prism assembly further includes a third illuminator including an LED ring light to provide off-axis illumination to the electronic substrate along the second optical path.

8. The stencil printer of claim 1, wherein the prism structure includes a first arm section, a second arm section and a connector section.

9. The stencil printer of claim 8, wherein the prism structure further includes two laminated polarizer on diffuser structures, which are installed with the polarizers facing the prism structure.

10. The stencil printer of claim 8, wherein the first arm section includes three prisms arranged to form a generally rectangularly-shaped block structure, the second arm section includes three prisms arranged to form a generally rectangularly-shaped block structure, and the connector section includes two prisms arranged to form a cube, which is disposed between the first arm structure and the second arm structure to create a generally U-shaped prism structure.

11. The stencil printer of claim 1, further comprising a first printed circuit board configured to control the dual camera assembly and a second printed circuit board configured to control remaining components of the vision system.

12. The stencil printer of claim 11, further comprising an LED board configured to control illumination of LEDs associated with the prism assembly.

13. The stencil printer of claim 11, wherein the first printed circuit board and the second printed circuit board are separated from one another by standoffs, with the first and second printed circuit boards being co-planer with respect to each other when assembled within and secured to the housing.

14. The stencil printer of claim 11, further comprising a fan module provided at one end of the housing to cool the components of the vision system, including the dual camera assembly, the prism assembly, the first printed circuit board and the second printed circuit board.

15. A vision system for use in a stencil printer configured to print an assembly material on an electronic substrate, the vision system comprising:
a housing;
a dual camera assembly supported by the housing, the dual camera assembly including a bracket, a first lens and a second lens secured to the bracket, the first lens and the second lens being spaced from each other and extending perpendicularly from the bracket, the dual camera assembly further including a first programmed camera configured to obtain an image of the stencil via a first optical path through the first lens and a second programmed camera configured to obtain an image of the electronic substrate via a second optical path through the second lens; and a prism assembly supported by the housing and configured with the dual camera assembly to provide a first optical path that looks vertically up at a bottom of a stencil and a second optical path that looks vertically down on the electronic substrate, the prism assembly including
a support having a base and a retainer, and
a prism structure that is positioned on the base and is secured in place with respect to the base when securing the retainer to the base, the prism structure being configured to direct light along the first optical path to the stencil and to direct light along the second optical path to the electronic substrate, and to direct an image from the stencil along the first optical path to the first programmed camera via the first lens and an image from the electronic substrate along the second optical path to the second programmed camera via the second lens.

16. The vision system of claim 15, wherein the dual camera assembly further includes a first heat sink secured to the first programmed camera by a first thermal pad and a second heat sink secured to the second programmed camera by a second thermal pad.

17. The vision system of claim 15, wherein the prism assembly further includes an optical window including a ¼ waveplate, which is secured in place with respect to the retainer by a cover, with the optical window being placed over an opening formed in the cover through which the first optical path to the stencil travels.

18. The vision system of claim 15, wherein the base of the prism assembly includes an opening through which the second optical path to the electronic substrate travels.

19. The vision system of claim 15, wherein the prism assembly further includes a dual-sided LED board, which is configured to generate light from one side of the LED board and from an opposite side of the LED board.

20. The vision system of claim 19, wherein the LED board includes a first illuminator having a matrix of LED lights provided on one side of the LED board and a second illuminator having a matrix of lights provided on the opposite side of the LED board.

21. The vision system of claim 20, wherein the prism assembly further includes a third illuminator including an LED ring light to provide off-axis illumination to the electronic substrate along the second optical path.

22. The vision system of claim 15, wherein the prism structure includes a first arm section, a second arm section and a connector section.

23. The vision system of claim 22, wherein the prism structure further includes two laminated polarizer on diffuser structures, which are installed with the polarizers facing the prism structure.

24. The vision system of claim 22, wherein the first arm section includes three prisms arranged to form a generally rectangularly-shaped block structure, the second arm section includes three prisms arranged to form a generally rectangularly-shaped block structure, and the connector section includes two prisms arranged to form a cube, which is disposed between the first arm structure and the second arm structure to create a generally U-shaped prism structure.

25. The vision system of claim 15, further comprising a first printed circuit board configured to control the dual camera assembly and a second printed circuit board configured to control remaining components of the vision system.

26. The vision system of claim 25, further comprising an LED board configured to control illumination of LEDs associated with the prism assembly.

27. The vision system of claim 25, wherein the first printed circuit board and the second printed circuit board are separated from one another by standoffs, with the first and second printed circuit boards being co-planer with respect to each other when assembled within and secured to the housing.

\* \* \* \* \*